(12) United States Patent
Gao et al.

(10) Patent No.: US 9,761,664 B1
(45) Date of Patent: Sep. 12, 2017

(54) INTEGRATED CIRCUITS WITH LATERAL BIPOLAR TRANSISTORS AND METHODS FOR FABRICATING THE SAME

(71) Applicant: Globalfoundries Singapore Pte. Ltd., Singapore (SG)

(72) Inventors: Wei Gao, Singapore (SG); Manjunatha Prabhu, Singapore (SG); Chien-Hsin Lee, Singapore (SG); Xiangxiang Lu, Singapore (SG); Vaddagere Nagaraju Vasantha Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/133,488

(22) Filed: Apr. 20, 2016

(51) Int. Cl.
*H01L 29/66* (2006.01)
*H01L 29/10* (2006.01)
*H01L 27/082* (2006.01)
*H01L 29/06* (2006.01)
*H01L 29/735* (2006.01)

(52) U.S. Cl.
CPC ........ *H01L 29/1008* (2013.01); *H01L 27/082* (2013.01); *H01L 29/0649* (2013.01); *H01L 29/6625* (2013.01); *H01L 29/735* (2013.01)

(58) Field of Classification Search
CPC .............. H01L 29/1008; H01L 29/735; H01L 29/6625; H01L 29/0649; H01L 27/082
USPC .................................. 257/197, 557, 558, 565
See application file for complete search history.

(56) References Cited

U.S. PATENT DOCUMENTS

| | | | |
|---|---|---|---|
| 5,298,786 A | 3/1994 | Shahidi et al. | |
| 5,395,775 A * | 3/1995 | Bertagnolli | ....... H01L 29/66265 148/DIG. 10 |
| 6,963,113 B2 | 11/2005 | Ang et al. | |
| 8,531,001 B2 | 9/2013 | Cai et al. | |
| 2003/0047750 A1* | 3/2003 | Russ | .................... H01L 27/0262 257/173 |
| 2004/0222486 A1* | 11/2004 | Ellis-Monaghan | ........................ H01L 29/66265 257/507 |
| 2009/0057813 A1* | 3/2009 | Wei | .................... H01L 21/76224 257/510 |
| 2011/0266630 A1* | 11/2011 | Suligoj | ............... H01L 21/8249 257/370 |
| 2014/0047750 A1* | 2/2014 | Siddle | .................... F41C 27/00 42/1.01 |
| 2015/0123240 A1* | 5/2015 | Bowman | ............. H01L 29/0688 257/506 |

* cited by examiner

*Primary Examiner* — Long K Tran
(74) *Attorney, Agent, or Firm* — Lorenz & Kopf, LLP

(57) ABSTRACT

Integrated circuits with lateral bipolar transistors and methods for fabricating the same are provided. An exemplary integrated circuit includes a semiconductor layer overlying an insulator layer. The semiconductor layer includes a first region having a first thickness and a trench region having a second thickness less than the first thickness. The integrated circuit further includes an isolation region formed over the trench region of the semiconductor layer. Also, the integrated circuit includes a lateral bipolar transistor including a base formed in the trench region of the semiconductor layer, an emitter, and a collector.

19 Claims, 4 Drawing Sheets

US 9,761,664 B1

INTEGRATED CIRCUITS WITH LATERAL BIPOLAR TRANSISTORS AND METHODS FOR FABRICATING THE SAME

TECHNICAL FIELD

The technical field generally relates to integrated circuits with lateral bipolar transistors, and more particularly, to integrated circuits with lateral bipolar transistors formed on semiconductor-on-insulator (SOI) structures.

BACKGROUND

Technology scaling unfavorably affects the electrostatic discharge (ESD) protection of integrated circuits mainly by reducing MOSFET oxide and junction breakdown voltage, diode current shunting capability, and by increasing interconnect resistivity. The input/output (I/O) data-rate increasingly limits the capacitive budget, exacerbating the shrinkage of ESD design space.

Semiconductor-on-insulator (SOI) technology presents some distinctive challenges to ESD design. The buried oxide (BOX) layer makes vertical and deep body ESD structures infeasible. The lateral SOI diode based ("rail-based") protection approach is becoming less effective in the high-current Charged Device Model (CDM) domain, owing to excessive voltage build-up along the ESD path involving power buses, power-clamps (Pclamp), and diodes. While various types of ESD devices have been proposed, there is a need for a suitable technique for ESD protection in fully depleted SOI (FDSOI) and/or partially depleted SOI (PD-SOI) technology.

Accordingly, it is desirable to provide integrated circuits with lateral bipolar transistors on SOI structures. Also, it is desirable to provide integrated circuits with lateral bipolar transistors on SOI structures that provide electrostatic discharge protection. Further, it is desirable to provide methods for fabricating integrated circuits with lateral bipolar transistors on SOI structures. It is desirable to provide methods for fabricating lateral bipolar transistors on SOI structures that do not need any special or additional layers or masks and allow for integration into existing fabrication process flows. Furthermore, other desirable features and characteristics will become apparent from the subsequent detailed description and the appended claims, taken in conjunction with the accompanying drawings and this background.

BRIEF SUMMARY

Integrated circuits with lateral bipolar transistors and methods for fabricating the same are provided. In an embodiment, an integrated circuit includes a semiconductor layer overlying an insulator layer. The semiconductor layer includes a first region having a first thickness and a trench region having a second thickness less than the first thickness. The integrated circuit further includes an isolation region formed over the trench region of the semiconductor layer. Also, the integrated circuit includes a lateral bipolar transistor including a base formed in the trench region of the semiconductor layer, an emitter, and a collector.

In another exemplary embodiment, an integrated circuit includes a semiconductor layer overlying an insulator layer on a semiconductor substrate and including an active area. The integrated circuit further includes an isolation trench lying within the active area and extending partially through the semiconductor layer. The isolation trench does not extend to the insulator layer. A partial trench isolation region is formed in the isolation trench. The integrated circuit further includes a gate structure overlying the partial trench isolation region and decoupled from the active area by the partial trench isolation region.

In another exemplary embodiment, a method for fabricating an integrated circuit is provided. The method includes providing a semiconductor layer overlying an insulator layer and doping the semiconductor layer with a first type dopant. The method also includes etching a trench partially into the semiconductor layer, wherein a trench portion of the semiconductor layer remains between the insulator layer and the trench. The method fills the trench with an isolation material and forms a gate structure over the isolation material. The method further includes doping the semiconductor layer with a second type dopant to form an emitter and a collector in the semiconductor layer. The gate structure prevents doping of the trench portion of the semiconductor layer, and the trench portion of the semiconductor layer forms a base.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits with lateral bipolar transistors and/or methods for fabricating integrated circuits with lateral bipolar transistors. Furthermore, there is no intention to be bound by any expressed or implied theory presented in the preceding technical field, background or brief summary, or in the following detailed description.

For the sake of brevity, conventional techniques related to integrated circuit fabrication may not be described in detail herein. Moreover, the various tasks and processes described herein may be incorporated into a more comprehensive procedure or process having additional steps or functionality not described in detail herein. In particular, various steps in the fabrication of integrated circuits are well-known and so, in the interest of brevity, many conventional steps will only be mentioned briefly herein or will be omitted entirely without providing the well-known process details.

As used herein, it will be understood that when an element or layer is referred to as being "over" another element or layer, it may be disposed directly on the other element or layer, or intervening elements or layers may be present. When an element or layer is referred to as being "on" another element or layer, it is directly on and in contact with the other element or layer. Further, spatially relative terms, such as "above", "lower", "upper", "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or an orientation of below in actual practice, with the term "below" merely being employed to describe the orientation in conjunction with the views shown in the accompanying figures. The device may be otherwise oriented (rotated 90 degrees or at other orientations) and the spatially relative descriptors used herein may likewise be interpreted accordingly.

Figure 1:
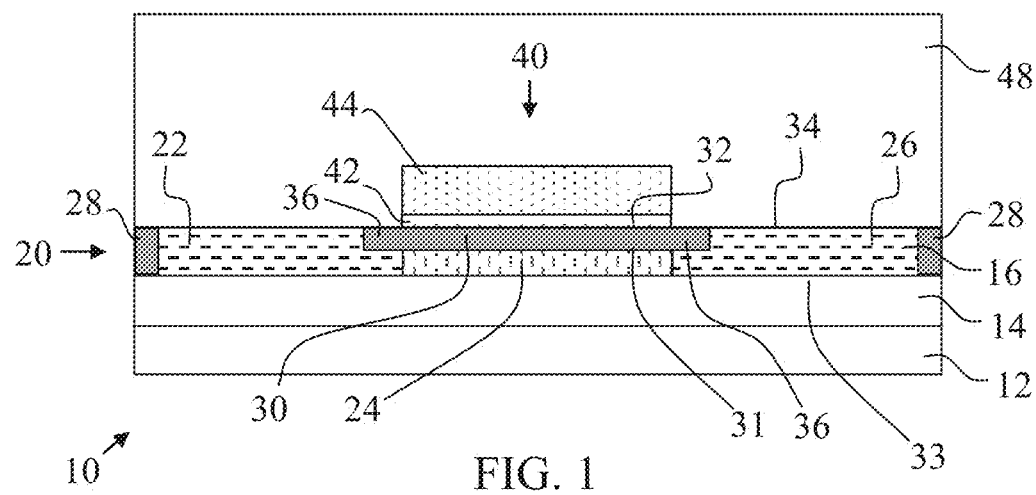
FIG. 1 is a cross sectional view of a portion of an integrated circuit including a lateral bipolar transistor formed on an SOI structure, according to an embodiment herein.

FIG. 1 is a cross sectional view of a portion of an integrated circuit 10 including a lateral bipolar transistor 20. As shown, the integrated circuit 10 includes a semiconductor substrate 12. For example, semiconductor substrate 12 may be silicon. An insulator layer 14 is formed on the semiconductor substrate 12. An exemplary insulator layer 14 is silicon oxide. As further shown, a semiconductor layer 16 is formed on the insulator layer 14. An exemplary semiconductor layer 16 is silicon. An exemplary semiconductor layer 16 is formed by epitaxial deposition over the insulator layer 14. Together, semiconductor substrate 12, insulator layer 14 and semiconductor layer 16 may be called an SOI substrate or structure. A silicon oxide insulator layer 14 is conventionally called a buried oxide layer. In an exemplary embodiment, the semiconductor layer 16 has a thickness of from about 100 to about 1000 Angstroms, and the insulator layer 14 has a thickness of from about 100 to about 1500 Angstroms.

As shown, an emitter 22, base 24 and collector 26 are formed in or from the semiconductor layer 16. The emitter 22, base 24 and collector 26 form the lateral bipolar transistor 20. In an exemplary embodiment, the emitter 22 and collector 26 are doped with a common dopant type, and the base 24 is doped with the opposite dopant type. In an exemplary embodiment, the emitter 22, base 24 and collector 26 each abut the insulator layer 14.

Also, complete isolation regions 28 may be formed adjacent the emitter 22 and collector 26 as shown. Complete isolation regions 28 extend completely through the semiconductor layer 16 and into contact with the underlying insulator layer 14 to completely isolate the lateral bipolar transistor 20 from adjacent devices on the integrated circuit 10.

Further, the integrated circuit 10 includes a partial trench isolation region 30 formed over the base 24. Partial trench isolation region 30 extends partially through the semiconductor layer 16, but does not extend completely through the semiconductor layer 16 and does not contact the underlying insulator layer 14. An exemplary partial trench isolation region 30 is silicon oxide. In an exemplary embodiment, the partial trench isolation region 30 includes a liner silicon oxide layer and a gap-filling silicon oxide layer. An exemplary partial trench isolation region 30 has a maximum thickness (in a vertical direction from bottom surface 31 to top surface 32) that is from about one-half to about three-quarters of the maximum thickness of the semiconductor layer 16 (in the vertical direction from lower surface 33 to upper surface 34). For example, for a semiconductor layer 16 having a thickness of about 100 Angstroms, the partial trench isolation region 30 has a thickness of from about 50 to about 75 Angstroms, and for a semiconductor layer 16 having a thickness of about 1000 Angstroms, the partial trench isolation region 30 has a thickness of from about 500 to about 750 Angstroms.

Likewise, the base 24 has a maximum thickness (in the vertical direction from the insulator layer 14 to the bottom surface 31 of the partial trench isolation region 30) that is less than, such as from about one-quarter to about one-half of, the maximum thickness (in the vertical direction) of the emitter 22 and/or collector 26. For example, for a semiconductor layer 16 having a thickness of about 100 Angstroms, the base 24 has a thickness of from about 25 to about 50 Angstroms, and for a semiconductor layer 16 having a thickness of about 1000 Angstroms, the base 24 has a thickness of from about 250 to about 500 Angstroms. In an exemplary embodiment, the top surface 32 of the partial trench isolation region 30 is co-planar with the upper surface 34 of the semiconductor layer 16 (or emitter 22 and collector 26).

Further, the base 24 has a maximum base length (in a horizontal direction perpendicular to the vertical direction) and the partial trench isolation region 30 has a maximum isolation length (in the horizontal direction) that is greater than the maximum base length. As a result, portions 36 of the partial trench isolation region 30 extend beyond the base 24 and into the emitter 22 and collector 26.

As shown in FIG. 1, a gate structure 40 is formed over the semiconductor layer 16. Specifically, the gate structure 40 is formed over the base 24. An exemplary gate structure 40 includes a dielectric layer 42 and a gate material layer or gate 44. In an exemplary embodiment, the dielectric layer 42 is silicon oxide and may be formed according to typical gate oxide processing. For exemplary, the dielectric layer 42 may be the same material as the partial trench isolation region 30. In an exemplary embodiment, the gate material layer 44 is formed from polycrystalline silicon, i.e., polysilicon. In FIG. 1, the gate structure 40 has a maximum gate length (in the horizontal direction) that is less than the isolation length and may be substantially equal to the base length. The gate structure 40 may have a height of from about 500 to about 2000 Angstroms. The height of the gate structure 40 can be greater than the thickness of the semiconductor layer 16 to facilitate a self-aligned implant. While not shown, the gate structure 40 may include sidewall spacers. The integrated circuit 10 of FIG. 1 further includes an interlayer dielectric material 48 that lies over the gate structure 40, partial trench isolation region 30, emitter 22, collector 26, and complete isolation regions 28.

It is contemplated that the lateral bipolar transistor 20 be a lateral NPN bipolar transistor or a lateral PNP bipolar transistor. As stated above, the emitter 22 and collector 26 are doped with a common dopant type, and the base 24 is doped with the opposite dopant type. For a lateral NPN bipolar transistor 20, the emitter 22 is an n-doped region (such as a heavily n-doped region), the base 24 is a p-doped region, and the collector 26 is an n-doped region (such as a heavily n-doped region). Likewise, for a lateral PNP bipolar transistor 20, the emitter 22 is a p-doped region (such as a heavily p-doped region), the base 24 is an n-doped region, and the collector 26 is a p-doped region (such as a heavily p-doped region). As used herein, "heavily doped" means having more than one dopant atom per one-hundred thousand atoms of semiconductor (such as silicon).

Figure 2:
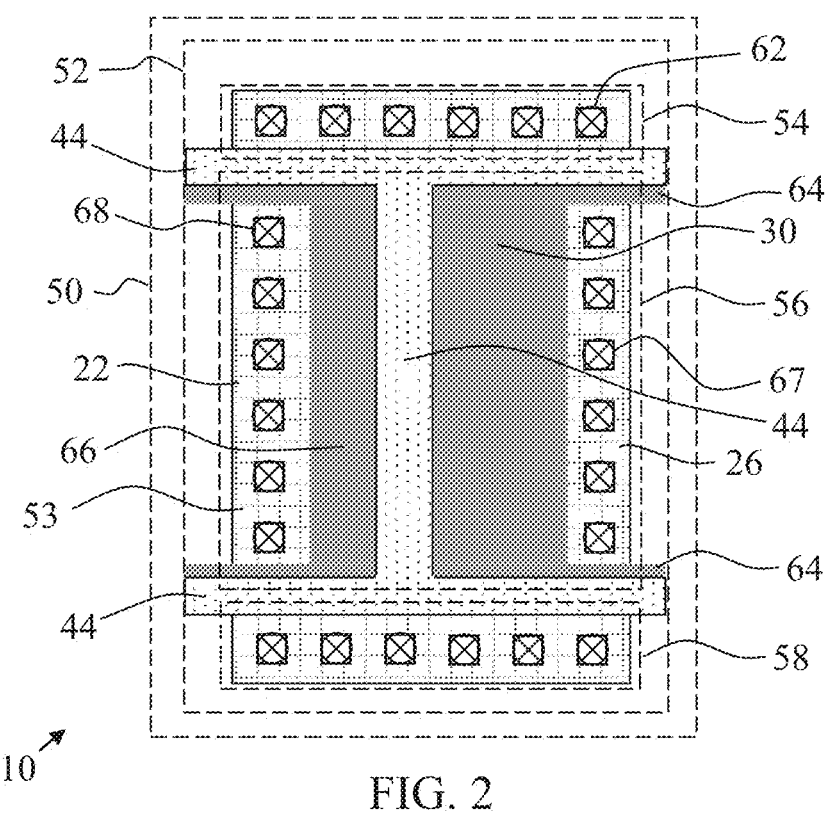
FIG. 2 is an overhead schematic of a portion of an integrated circuit including a lateral bipolar transistor formed on an SOI structure, according to an embodiment herein.

FIG. 2 illustrates an overhead schematic view of a portion of the integrated circuit 10 similar, though not identical, to that shown in FIG. 1. For example, FIG. 2 illustrates regions peripheral to the portion of FIG. 1. In FIG. 2 it can be seen that an ESD protection device region 50 includes a well region 52 doped with the first dopant type. Within the well region 52, an active layer 53 is formed. The active layer 53 includes an active region 54 that is heavily doped with the first dopant type, an active region 56 that is heavily doped with the second dopant type, and an active region 58 that is heavily doped with the first dopant type. In an exemplary embodiment, active regions 54 and 58 are heavily p doped, while active region 56 is heavily n doped. Alternatively, active regions 54 and 58 may be heavily n doped, while active region 56 is heavily p doped.

Figure 3:
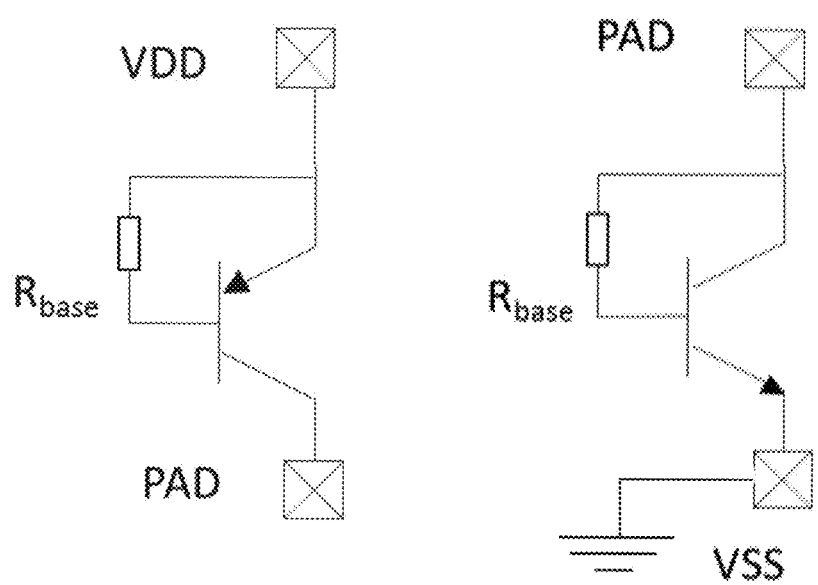
FIG. 3 is a schematic diagram of a bidirectional lateral bipolar transistor, according to an embodiment herein.

Further, the integrated circuit 10 is provided with electrical contacts 62 (the terminal connection for base region 24 in FIG. 1), electrical contacts 67 (the terminal connection for collector region 26) and electrical contacts 68 (the terminal connection for emitter region 22). For example, an inverter circuit may include an input terminal electrically coupled to the base 24. Additionally, the inverter circuit may include an output terminal electrically coupled to the emitter 22 or collector 26. The inverter circuit may be powered with a power voltage line VDD electrically coupled to the emitter 22 or collector 26. Also, a ground voltage line may be electrically coupled to the emitter 22 or collector 26. FIG. 3 illustrates an exemplary inverter circuit. $R_{base}$ is the resistance of base region. When the voltage dropped to it is greater than diode turn-on voltage (such as from about 0.6 to about 0.7 V), the NPN or PNP transistor will be triggered to turn on.

In FIG. 2, the gate 44 is separated from the underlying substrate structure by the partial trench isolation region 30. In other words, the entirely of the gate 44 lies over the partial trench isolation region 30 such that no part of the footprint of the gate 44 extends outside of the footprint of the partial trench isolation region 30. Further, it can be seen in FIG. 2, that the partial trench isolation region 30 includes extending portions 64 that provide for isolation of the body contact area. The central portion 66 of the partial trench isolation region 30 connects the extending portions 64 to form a continuous partial trench isolation region 30 under the gate 44.

Figure 4:
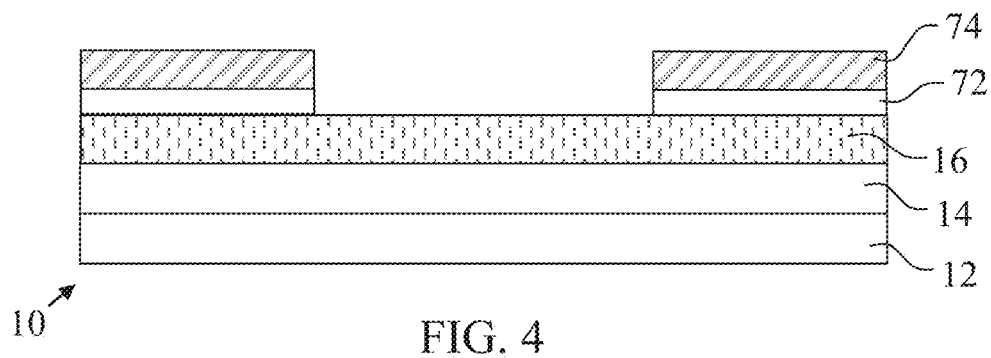
FIGS. 4-9 are cross sectional views illustrating a process for fabricating an integrated circuit with a lateral bipolar transistor according to an exemplary embodiment.

Referring to FIGS. 4-9, a process for fabricating an integrated circuit 10 with a lateral bipolar transistor 20 is described. In FIG. 4, the SOI structure previously described is provided and includes a semiconductor substrate 12, insulator layer 14 and semiconductor layer 16. The SOI structure may be fabricated according to any of the conventional methods, such as SIMOX, silicon implant through oxide, or wafer bonding techniques. The insulator layer 14 and substrate 12 may have a combined thickness of from about 200 to about 2500 Angstroms. In certain embodiments, the semiconductor layer 16 may be formed by epitaxial deposition. An exemplary semiconductor layer 16 is epitaxially grown, for example, on a silicon oxide insulator layer 14 to a thickness of from about 100 and to about 1000 Angstroms. A masked implantation process may then be performed to dope the semiconductor layer 16 to from about $1 \times 10^{18}$ parts/cm$^3$ to about $1 \times 10^{19}$/cm$^3$ with appropriate type dopant ions.

In FIG. 4, a stress relief layer 72 is deposited over the semiconductor layer 16. For example, the stress relief layer 72 may be silicon oxide. In an exemplary embodiment the stress relief layer 72 is deposited by low pressure chemical vapor deposition (LPCVD) to a thickness of from about 100 and to about 500 Angstroms.

As shown, a hard mask layer 74 is formed over the stress relief layer 72. An exemplary hard mask layer 74 is a dielectric material, such as silicon nitride. The hard mask layer 74 and stress relief layer 72 are patterned as shown in FIG. 4 for the formation of a partial trench isolation region.

Figure 5:
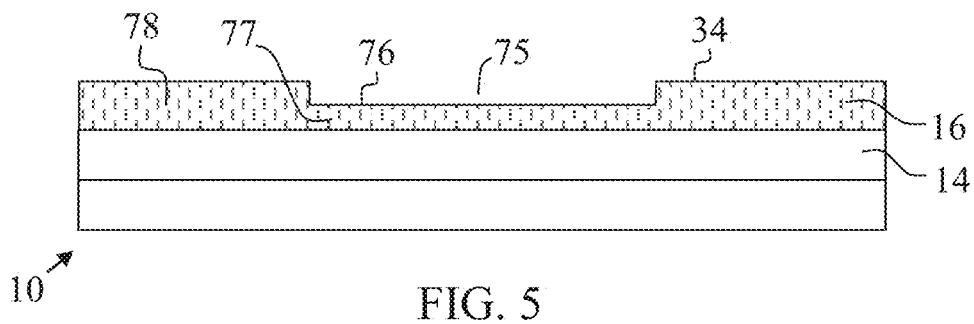

In FIG. 5, an etch process is performed to pattern a partial trench 75 which extends partially into the semiconductor layer 16. As shown, the partial trench 75 extends partially through the semiconductor layer 16, but does not extend completely through the semiconductor layer 16 to contact the insulator layer 14. Rather, the partial trench 75 extends to a bottom surface 76. In an exemplary embodiment, the partial trench 75 has a depth of from about one-half to about three-quarters of the thickness of the semiconductor layer 16. As shown, a trench portion 77 of the semiconductor layer 16 remains under the partial trench 75. The trench portion 77 has a thickness of from about one-quarter to about one-half of the thickness of the unetched remaining portion 78 of the semiconductor layer 16. In other words, the minimum distance between the insulator layer 14 and the bottom surface 76 is from about one-quarter to about one-half of the minimum distance between the insulator layer and the upper surface 34.

After forming the partial trench 75, the hard mask layer 74 and stress relief layer 72 are removed. For example, the hard mask layer 74 and stress relief layer 72 may be removed by hydrofluoric acid or other chemical etching.

Figure 6:
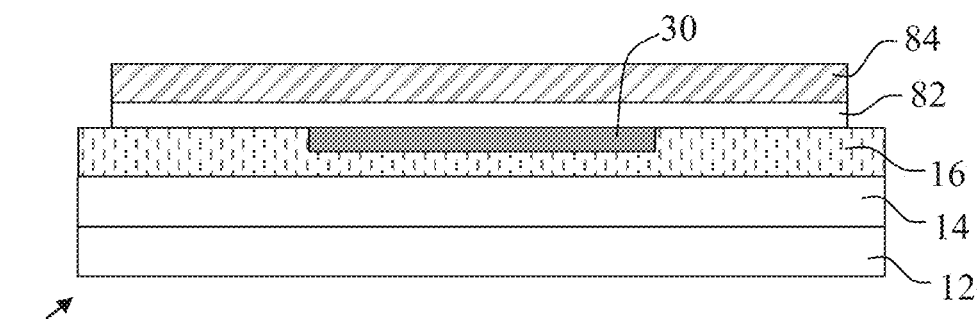

In FIG. 6, the partial trench 75 is filled with an isolation material to form the partial trench isolation region 30. An exemplary isolation material is silicon oxide. For example, a liner silicon oxide layer, not shown, first may be grown on the sidewalls and bottom of the partial trench, such as by LPCVD to a thickness of from about 100 to about 500 Angstroms. Then a gap filling silicon oxide layer, such as high density plasma (HDP) oxide may be deposited to fill the trench, as shown in FIG. 6.

In FIG. 6, the process may continue with the formation of trench isolation regions to separate active areas. A stress relief layer 82 is deposited over the semiconductor layer 16 and partial trench isolation region 30 to a thickness of from about 100 to about 500 Angstroms. A hard mask layer 84 is formed over the stress relief layer 82. An exemplary hard mask layer 84 is a dielectric, such as silicon nitride. The hard mask layer 84 and stress relief layer 82 are patterned as shown in FIG. 6 for the formation of isolation trenches.

Figure 7:
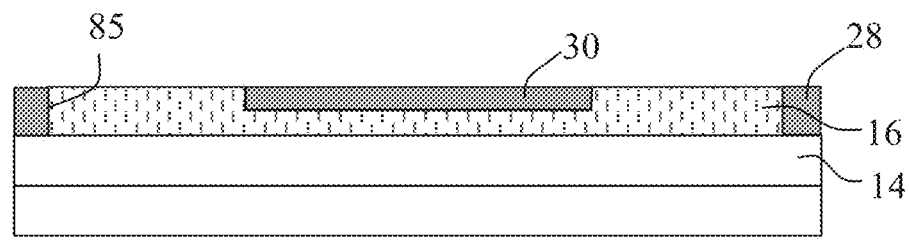

In FIG. 7, an etch process is performed to pattern trenches 85 that extend completely through the semiconductor layer 16 to the insulator layer 14. The hard mask layer 84 and stress relief layer 82 are removed. Further, the trenches 85 are filled with an insulator material to form complete isolation regions 28 by any of the conventional fill methods. For example, a liner oxide layer, not shown, first may be grown on the sidewalls and bottom of the trenches 85, such as by LPCVD to a thickness of from about 100 to about 500 Angstroms. Then a gap filling silicon oxide layer, such as high density plasma (HDP) oxide may be deposited to fill the trenches 85.

Figure 8:
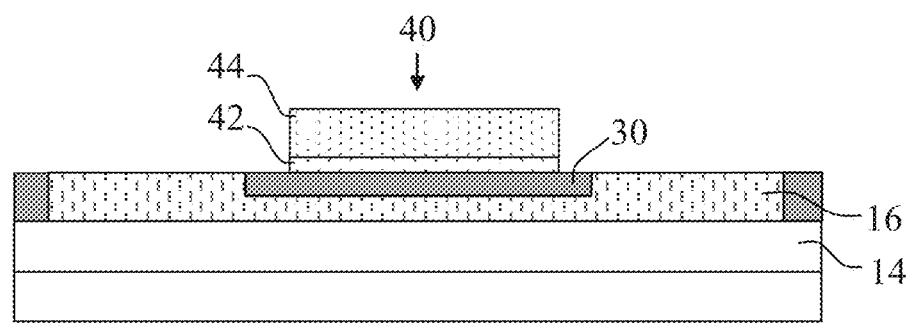

In FIG. 8, gate structure 40 is formed over the partial trench isolation region 30. An exemplary gate structure 40 includes a dielectric layer 42 and a gate material layer 44. An exemplary dielectric layer 42 is silicon oxide. An exemplary gate material layer 44 is formed from polysilicon. An exemplary gate structure 40 has a height of from about 500 to about 2000 Angstroms. The gate structure 40 may have a height greater than the thickness of the semiconductor layer 16 to facilitate a self-aligned implantation process.

The gate structure layers are deposited and patterned according to conventional processing to form the gate structure 40. Specifically, the gate material layer 44 and dielectric layer 42 are etched selective to the underlying partial trench isolation region 30 and semiconductor layer 16. In addition, sidewall spacers (not shown) may be formed by depositing a dielectric layer (e.g., silicon nitride) followed by an etch back.

Figure 9:
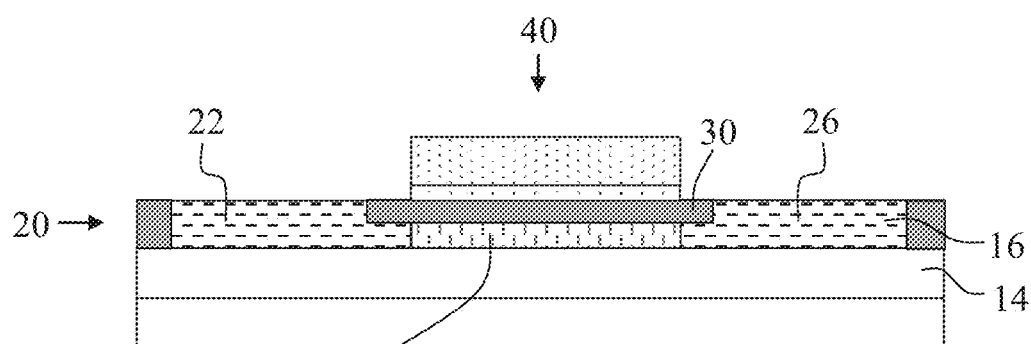

Processing continues to form the emitter 22, base 24 and collector 26 in and on the semiconductor layer 16, as illustrated in FIG. 9. For example, a self-aligned implant is performed to form heavily doped emitter 22 and heavily doped collector 26 regions using the gate structure 40 as an implant mask. For a lateral NPN bipolar transistor 20, the emitter 22 and collector 26 regions are doped n-type. For a lateral PNP bipolar transistor 20, the emitter 22 and collector 26 regions are doped p-type. In either case, the doping concentration may be in the range of $5 \times 10^{19}$ parts/cm$^3$ to $5 \times 10^{20}$ parts/cm$^3$.

The lateral bipolar transistor 20 is electrically isolated and decoupled from the gate structure 40 by the partial trench isolation region 30. In other words, the gate effect is electrically suppressed from the base by the partial trench isolation region 30. Therefore, an exemplary partial trench isolation region 30 has a thickness sufficient to provide such electrically isolation. An exemplary partial trench isolation region 30 has a thickness of more than about 100 Angstroms. Because the gate structure 40 is decoupled from the lateral bipolar transistor 20, further processing of the gate structure 40 is unnecessary. Specifically, no removal of the gate structure is necessary. As a result, processing steps are reduced as compared to conventional fabrication processing in which the polysilicon gate material layer 44 and the underlying dielectric layer 42 are removed from both NPN and PNP lateral bipolar transistor device areas.

The method may continue by depositing an interlayer dielectric material 48 over the structure of FIG. 9, as shown in FIG. 1. For example, the interlayer dielectric material 48 may be blanket deposited over the lateral bipolar transistor 20 and gate structure 40 to a thickness of from about 6000 to about 20,000 Angstroms. The interlayer dielectric material 48 may include sub-atmospheric borophosphosilicate glass (BPSG), tetraethoxysilane (TEOS) oxide, fluorinated silicate glass (FSG), and low dielectric constant dielectrics, for example.

The electrical contacts 62 shown in FIG. 2 may be formed by etching contact openings through the interlayer dielectric material 48 to selected underlying regions in the lateral bipolar transistor 20, such as the emitter 22, base 24, and collector 26 regions, partial trench isolation region 30, or complete isolation regions 28. Thereafter, a conducting layer, such as tungsten or an aluminum/copper alloy, is deposited over the interlayer dielectric material 48 and within the contact openings. The conducting layer may be etched back to leave plugs forming the electrical contacts 62.

After formation of the partially completed integrated circuit 10 of FIGS. 1 and 2, further typical processing may be performed, such as connection to an interconnect structure and processing elsewhere on the substrate 12. For example, the lateral bipolar transistor may be connected in a circuit to provide ESD protection to other devices.

The process described herein may result in the formation of a fully depleted semiconductor-on-insulator (FDSOI) lateral bipolar transistor 20 or a partially depleted semiconductor-on-insulator (PDSOI) lateral bipolar transistor 20 providing electrostatic discharge (ESD) protection. The device includes a semiconductor layer 16 overlying an insulator layer 14 on a semiconductor substrate 12. Isolation regions 28 extend fully through the semiconductor layer 16 to the underlying insulator layer 14 wherein the partial trench isolation region 30 does not separate active areas of the lateral bipolar transistor 20 but rather lies over the base 24 and over a portion of the emitter 22 and collector 26 while electrically decoupling the overlying gate structure 40 from the components of the lateral bipolar transistor 20. As a result, the gate structure 40 need not be removed during processing. Specifically, the gate structure 40 may be formed during gate formation processing on the rest of the substrate 12, and utilized during a self-aligned implantation process for forming the lateral bipolar transistor 20. After formation of the lateral bipolar transistor 20, the gate structure 40 may remain overlying the base 24 because the partial trench isolation region 30 electrically decouples the gate structure 40 from the lateral bipolar transistor 20 with no detrimental effects on transistor device performance. In addition, this design also accommodates for process window considerations. Further, due to the bidirectionality of the bipolar transistor, an ESD protection device may be formed with a reduced footprint as compared to conventional processing.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit comprising:
   a semiconductor layer overlying an insulator layer, wherein the semiconductor layer includes a first region having a first thickness and a trench region having a second thickness less than the first thickness;
   an isolation region formed over the trench region of the semiconductor layer; and
   a lateral bipolar transistor including a base contained completely within the trench region of the semiconductor layer, an emitter, and a collector.

2. The integrated circuit of claim 1 further comprising a gate structure formed over the isolation region.

3. The integrated circuit of claim 2 wherein the gate structure has a first length and the isolation region has a second length greater than the first length, such that a central portion of the gate structure lies over the isolation region and a remaining portion of the isolation region extends into the emitter and/or collector.

4. The integrated circuit of claim 2 wherein the gate effect is electrically suppressed from the base by the isolation region.

5. The integrated circuit of claim 1 wherein the emitter is formed in the first region of the semiconductor layer and the collector is formed in the first region of the semiconductor layer.

6. The integrated circuit of claim 1 wherein the lateral bipolar transistor is a lateral NPN bipolar transistor, the emitter is an n-doped region, the base is a p-doped region, and the collector is an n-doped region.

7. The integrated circuit of claim 1 wherein the lateral bipolar transistor is a lateral PNP bipolar transistor, the emitter is a p-doped region, the base is an n-doped region, and the collector is a p-doped region.

8. The integrated circuit of claim 1 wherein the semiconductor layer is an epitaxial layer.

9. The integrated circuit of claim 1 wherein the isolation region comprises a liner oxide layer and a gap-filling oxide layer.

10. The integrated circuit of claim 1 wherein the second thickness is from about one-quarter to about one-half of the first thickness.

11. The integrated circuit of claim 1 wherein the first region of the semiconductor layer has an upper surface, wherein the isolation region has a top surface, and wherein the upper surface and the top surface are substantially co-planar.

12. An integrated circuit comprising:
a semiconductor layer overlying an insulator layer on a semiconductor substrate and including an active area;
an isolation trench lying within the active area and extending partially through the semiconductor layer, wherein the isolation trench does not extend to the insulator layer;
a partial trench isolation region formed in the isolation trench; and
a gate structure overlying the partial trench isolation region and decoupled from the active area by the partial trench isolation region, wherein the gate structure includes a gate dielectric layer directly on the partial trench isolation region and a gate material layer over the gate dielectric layer.

13. The integrated circuit of claim 12 further comprising a lateral bipolar transistor including a base formed in the semiconductor layer below the partial trench isolation region, an emitter formed in the semiconductor layer, and a collector formed in the semiconductor layer.

14. The integrated circuit of claim 13 wherein the lateral bipolar transistor is a lateral NPN bipolar transistor, the emitter is an n-doped region, the base is a p-doped region, and the collector is an n-doped region.

15. The integrated circuit of claim 13 wherein the lateral bipolar transistor is a lateral PNP bipolar transistor, the emitter is a p-doped region, the base is an n-doped region, and the collector is a p-doped region.

16. The integrated circuit of claim 13 wherein the semiconductor layer is an epitaxial layer.

17. The integrated circuit of claim 13 wherein the partial trench isolation region comprises a liner oxide layer and a gap-filling oxide layer.

18. The integrated circuit of claim 13 wherein the semiconductor layer has thickness and wherein the isolation trench extends into the semiconductor layer to a depth of from about one-half to about three-quarters of the thickness of the semiconductor layer.

19. The integrated circuit of claim 13 wherein the semiconductor layer has an upper surface, wherein the partial trench isolation region has a top surface, and wherein the upper surface and the top surface are substantially co-planar.

* * * * *